United States Patent [19]

Treise

[11] Patent Number: 4,495,473
[45] Date of Patent: Jan. 22, 1985

[54] DIGITAL PHASE SHIFTING APPARATUS WHICH COMPENSATES FOR CHANGE OF FREQUENCY OF AN INPUT SIGNAL TO BE PHASE SHIFTED

[75] Inventor: Jan E. Treise, W. Melbourne, Fla.

[73] Assignee: Rockwell International Corporation, El Segundo, Calif.

[21] Appl. No.: 399,678

[22] Filed: Jul. 19, 1982

[51] Int. Cl.³ .................. H03H 11/20; H03L 7/06
[52] U.S. Cl. ............................. 331/10; 331/17; 331/25; 375/120; 455/260; 328/24; 328/155
[58] Field of Search ............ 331/10, 17, 18, 25; 343/420; 455/260; 375/120; 328/155, 24

[56] References Cited

U.S. PATENT DOCUMENTS

| | | | |
|---|---|---|---|
| 4,190,807 | 2/1980 | Weber | 328/155 X |
| 4,309,649 | 1/1982 | Naito | 328/155 X |
| 4,336,505 | 6/1982 | Meyer | 331/17 X |
| 4,393,516 | 7/1983 | Itani | 375/120 X |

Primary Examiner—Siegfried H. Grimm
Assistant Examiner—D. C. Mis
Attorney, Agent, or Firm—Bruce C. Lutz; Robert C. Mayes; H. Fredrick Hamann

[57] ABSTRACT

Phase shifting apparatus is illustrated using a feedback loop to monitor the frequency and correct the phase shifting mechanism so that the desired amount of phase shift will occur at all frequencies. The phase shifter comprises a multistage storage means which samples the incoming signal periodically and outputs this information after a time delay. This time delay will vary for a given amount of phase shift depending upon the frequency. Thus, the feedback loop adjusts the sampling time whereby the time period of the sample times is electrically correct.

3 Claims, 1 Drawing Figure

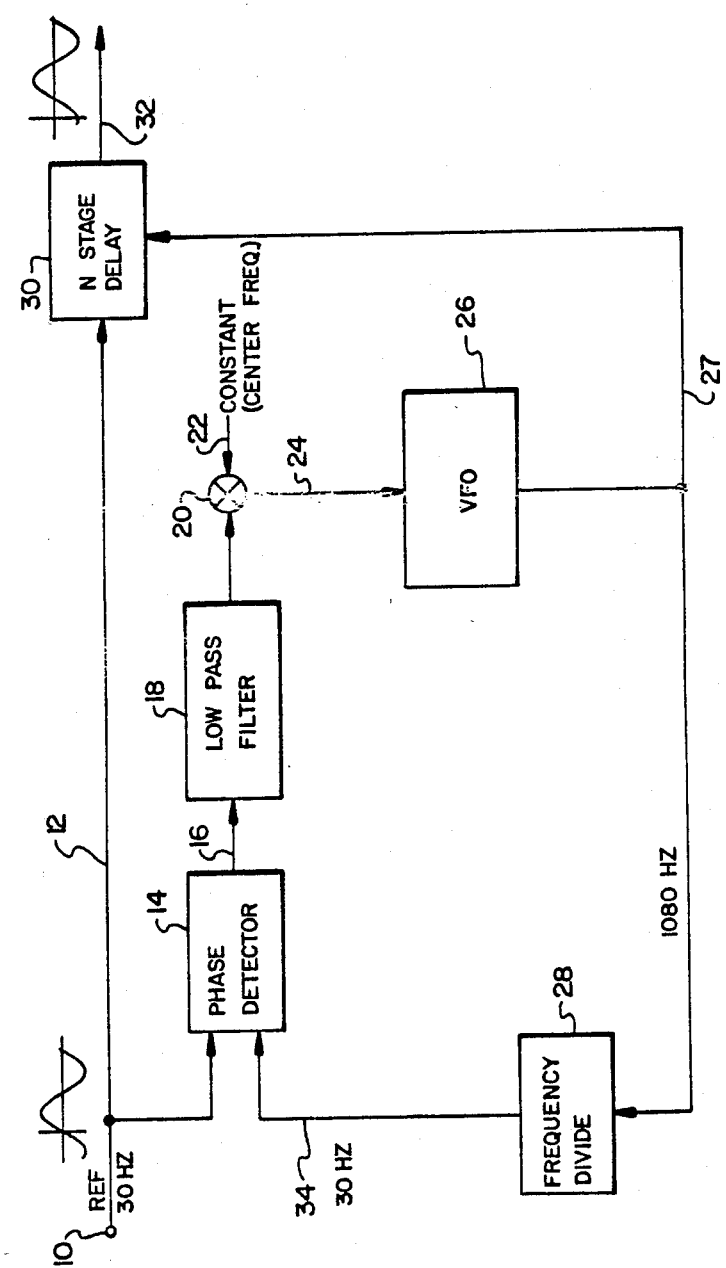

DIGITAL PHASE SHIFTING APPARATUS WHICH COMPENSATES FOR CHANGE OF FREQUENCY OF AN INPUT SIGNAL TO BE PHASE SHIFTED

THE INVENTION

The present invention generally relates to electronics and more specifically relates to phase shifting apparatus. Even more specifically, the present invention relates to an electronic phase shifter using a feedback loop for accuracy over a range of frequencies heretofore unmatched.

Very low frequency omni ranging (VOR) ground stations used in aircraft navigation procedures transmit signals which indicate bearing from the station, to the subject aircraft, as the phase difference between two 30 hertz signals. One of these signals, "the variable phase", is amplitude modulated on a carrier while the other, "the reference phase", is transmitted as frequency modulation on a 9960 hertz subcarrier which is amplitude modulated on the carrier. In a VOR receiver, the two signals are recovered and applied to a signal processor. When this processor is a digital device, the two signals are sampled on a periodic basis rather than a continuous basis for determining phase difference.

One method of determining the phase difference is by using in-phase and quadrature phase reference signals. The product of the reference phase and the variable phase is formed according to Equation 1:

$$\text{Ref Var} = RV \sin(\omega t) \sin(\omega t - \theta) \quad (1)$$

$$= \frac{RV}{2}(\cos\theta - \cos(2\omega t - \theta))$$

This signal is then filtered to remove the double frequency and non-coherent noise components as illustrated in Equation 2:

$$\frac{RV}{2}\cos\theta \quad (2)$$

A quadrature (90 degree phase shifted) reference signal is generated and the product of it and the variable is formed according to Equation 3:

$$\text{Quad Var} = RV \sin(\omega t - \pi/2) \sin(\omega t - \theta) \quad (3)$$

$$= \frac{RV}{2}(\sin\theta - \sin(2\omega t - \theta))$$

The result of Equation 3 is filtered to provide the result listed in Equation 4:

$$\frac{RV}{2}\sin\theta \quad (4)$$

In each of these equations the reference signal is designated as $R \sin(\omega t)$. The variable signal is designated as $V \sin(\omega t - \theta)$ where $\theta$ equals the station bearing and the quadarature signal is designated as $R \sin(\omega t - \pi/2)$.

The bearing of the station with respect to the detector is measured by computing the arc-tangent of the two filtered signals as illustrated in Equation 5:

$$\text{Station Brg} = \tan^{-1}\frac{\frac{RV}{2}\sin\theta}{\frac{RV}{2}\cos\theta} = \theta \quad (5)$$

This technique gives an accurate result as long as the reference and quadrature have the same amplitude and the phase shift between them is exactly 90 degrees. While the equations above have been known for a considerable period of time, the prior art methods of maintaining an accurate phase shift over a variation of frequency signals around the 30 hertz nominal or normal frequency has been poor enough that good bearing measurements using these formulas have not been easily obtained.

The present invention provides a high degree of accuracy by using a sampled reference signal which is passed through an N-stage delay line. The delay line length is chosen to be 90 degrees at the center frequency when a quadrature reference signal is to be generated. Since the 30 hertz signal has an associated tolerance, typically in the order of ±1 percent, the delay line has to be compensated whereby the sample time is adjusted such that the N-stage delay line is exactly 90 degrees over the frequency tolerance of the 30 hertz signal.

To accomplish the "shrinking and stretching" of the delay line, the sample frequency is phase locked to a harmonic of the 30 hertz reference. This harmonic is 4N times 30 hertz where N is the number of stages in the delay line. A signal is generated which has 4N sample times as its period. This signal is applied to a phase comparator along with the sampled reference signal. The output of the comparator is filtered and used to adjust the sample time to frequency lock the sample period to the reference signal. The phase locked loop thus is used to set the correct sample frequency to adjust the delay line length.

DETAILED DESCRIPTION

A terminal 10 is used to provide a reference phase input signal on a lead 12 to one input of an exclusive OR gate or other phase detecting means 14 which has an output supplying a DC voltage related to the phase difference plus a double frequency or 60 hertz signals on a lead 16 to a low-pass filter 18. A direct voltage output of filter 18 is supplied to a summing means 20 which has a further input on lead 22 which supplies a constant or centering frequency signal. An output of scanning means 20 is supplied on a lead 24 to a variable frequency oscillator (VFO) or voltage controlled oscillator (VCO) 26 which supplies output signals to a frequency divide block 28 and provides an input to an N-stage delay block 30. Block 30 also receives input signals from the 30 hertz signal source on lead 12. Block 30 provides an output on a lead 32 which is a time delayed (phase shifted) version of the signal input on lead 12. The frequency divide block 28 provides signals on a lead 34 to a second input of phase detector 14.

OPERATION

The operation of the present invention will be provided on the basis of having a 90 degree phase shift. However, during the course of explanation, it should be realized that any amount of phase delay may be obtained by adjusting the values of the number of stages of delay for block 30, in conjunction with the frequency of operation of VFO 26 and the frequency divider 28.

A reference signal on lead 12 is supplied to phase detector 14 which provides an output on lead 16 based on the phase variation between the two inputs. If the signal supplied on lead 10 is a digital signal, the phase detector 14 may be an exclusive OR circuit. The exclusive OR circuit will detect the variation in amplitudes by detecting only the sign bit. This will result in a 60 hertz signal output on lead 16 as long as there is any phase differential whatsoever. The block 30, if the input is an analog signal, will sample the signal at times determined by the frequency of the signal incoming on lead 27 and output the samples on lead 32 N-time periods later. If the incoming signal is a digital signal, the block 30 will merely store the digital amplitudes representative of the incoming signal and output this value N-time periods later. Thus, the phase of the signal is delayed by an exact amount as long as the frequency of the signal on lead 27 is an exact multiple of the incoming frequency signal supplied on lead 12. The signal on lead 12 can be a continuously, but slowly, varying digital signal representative of instantaneous amplitudes and the sampling block 30 will still operate correctly. Thus, the phase lock loop takes the phase detected signal on lead 16, filters it in block 18, sums this with a constant on lead 22 such that the VFO 26 has a center frequency which is an exact multiple of the typical reference frequency. The compensating signal from the phase detector is used to vary this frequency so that it remains an exact multiple of the reference frequency through its tolerance variation. Each stage of block 30 has a time delay of 1/(sample frequency). Thus, if block 30 has nine stages, each stage will represent ten degrees or 926 microseconds delay. If the reference frequency drops slightly below 30 hertz, the time delay of each stage will increase, such that it maintains a ten degree phase delay.

Although the present invention is illustrated as an analog circuit and was described from both an analog and a digital standpoint, it is to be realized that the concept can be practiced completely in digital format with a majority of the steps being performed with software.

Thus, I wish to be limited not by the circuit shown exactly but only by the scope of the appended claims wherein I claim:

1. Digital phase shifting means comprising, in combination:
   first means for supplying a signal to be phase shifted;
   time variable signal sampling means having signal and control input means and phase shifted output signal means and including sampled data serial delay storage means, the time between samples being a direct function of the frequency of the signal to be phase shifted and the total delay between input and output being inversely proportional to the frequency of the signal being phase shifted;
   phase detecting means including first and second input means and output means;
   means directly connecting said first means to said signal input means of said sampling means and to said first input means of said phase detecting means;
   variable frequency oscillator means including control input means and variable frequency output means;
   second means connecting said output means of said phase detecting means to said control input means of said oscillator means for varying the output frequency thereof from a quiescent center frequency; and
   means for connecting said output means of said oscillator means to said control input means of said sampling means and to said second input means of said phase detecting means.

2. The method of digitally phase shifting a variable frequency signal comprising, the steps of:
   phase detecting the variable frequency signal relative to an internally generated second signal to provide a control signal;
   adjusting the frequency of operation of a variable frequency oscillator in accordance with said control signal to provide a variable frequency sampling output signal which is a frequency multiple of the variable frequency signal;
   deriving said second signal from said variable frequency sampling output signal;
   sampling said variable frequency signal as a direct function of the frequency of said variable frequency sampling output signal; and
   storing samples of said variable frequency signal as obtained in the preceding step before outputting same a number of sample times later equivalent to a predetermined desired phase shift of the variable frequency signal.

3. Apparatus for digitally phase shifting a reference first signal comprising, in combination:
   first means for supplying a reference first signal;
   second means for supplying an internally generated second signal;
   third means for phase detecting said reference first signal relative said second signal to provide a control third signal;
   fourth means, connected to said third means, for adjusting the frequency of operation of a variable frequency oscillator in accordance with said control third signal to provide a variable frequency sampling output fourth signal which is a frequency multiple of said reference first signal;
   fifth means for deriving said second signal from said variable frequency sampling output fourth signal;
   sixth means for sampling said reference first signal as a direct function of the frequency of said variable frequency sampling output fourth signal; and
   seventh means for storing samples of said reference first signal as obtained by said sixth means before outputting same a number of sample times later equivalent to a predetermined desired phase shift of the reference first signal, the total delay before outputting same being inversely proportional to the frequency of said reference first signal.

* * * * *